US008289662B2

(12) United States Patent
Iben

(10) Patent No.: US 8,289,662 B2
(45) Date of Patent: Oct. 16, 2012

(54) TUNNEL JUNCTION RESISTOR FOR HIGH RESISTANCE DEVICES AND SYSTEMS USING THE SAME

(75) Inventor: Icko E. T. Iben, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 1097 days.

(21) Appl. No.: 12/123,989

(22) Filed: May 20, 2008

(65) Prior Publication Data

US 2009/0289626 A1    Nov. 26, 2009

(51) Int. Cl.
*G11B 5/39* (2006.01)
(52) U.S. Cl. ..................... 360/324.2; 257/421
(58) Field of Classification Search .................. 257/421; 360/324–324.2
See application file for complete search history.

(56) References Cited

U.S. PATENT DOCUMENTS

| | | | | |
|---|---|---|---|---|
| 3,169,200 | A * | 2/1965 | Huffman | 310/306 |
| 4,536,781 | A | 8/1985 | Kroger | 357/5 |
| 6,194,737 | B1 | 2/2001 | Ohshima | 257/30 |
| 6,347,049 | B1 | 2/2002 | Childress et al. | 365/173 |
| 6,356,477 | B1 * | 3/2002 | Tran | 365/158 |
| 6,667,860 | B1 | 12/2003 | Granstrom et al. | 360/323 |
| 6,754,098 | B2 * | 6/2004 | Kunikiyo | 365/158 |
| 6,944,048 | B2 * | 9/2005 | Iwata | 365/158 |
| 6,980,466 | B2 * | 12/2005 | Perner et al. | 365/158 |
| 2002/0145835 | A1 * | 10/2002 | Suzuki et al. | 360/324.2 |
| 2005/0276097 | A1 * | 12/2005 | Perner et al. | 365/158 |
| 2006/0220058 | A1 * | 10/2006 | Tavkhelidze | 257/104 |
| 2007/0235322 | A1 * | 10/2007 | Wu et al. | 204/192.34 |

FOREIGN PATENT DOCUMENTS

| | | | |
|---|---|---|---|
| EP | 1291879 A2 | | 3/2003 |
| JP | 03241869 A | * | 10/1991 |
| JP | 06053524 A | * | 2/1994 |
| JP | 08046172 A | * | 2/1996 |
| JP | 11112054 A | * | 4/1999 |
| JP | 2001217479 A | * | 8/2001 |
| JP | 2006019006 A | * | 1/2006 |

OTHER PUBLICATIONS

U.S. Appl. No. 12/015,438, filed Jan. 16, 2008.
E. Wichmann, Quantum Physics: Chapter 7, The Wave Mechanics of Schrodinger, Berkeley physics course, vol. 4, McGraw-Hill 1971, pp. 288-292.
S. S. P. Parkin, et al., "Exchange-biased magnetic tunnel junctions and application to nonvolatile magnetic random access memory (invited)," 1999 American Institute of Physics, J. of Applied Physics, vol. 85, No. 8, 1999, pp. 5828-5833).

(Continued)

*Primary Examiner* — Will J Klimowicz
(74) *Attorney, Agent, or Firm* — Zilka-Kotab, PC

(57) ABSTRACT

A device in one embodiment includes a plurality of tunnel junction resistors coupled in series; a first lead coupled to one end of the plurality of tunnel junction resistors coupled in series; and a second lead coupled to another end of the plurality of tunnel junction resistors coupled in series. A device in another embodiment includes a magnetoresistive sensor; a plurality of tunnel junction resistors coupled in series; a first lead coupling one end of the magnetoresistive sensor to one end of the plurality of tunnel junction resistors coupled in series; and a second lead coupling another end of the magnetoresistive sensor to another end of the plurality of tunnel junction resistors coupled in series.

13 Claims, 15 Drawing Sheets

OTHER PUBLICATIONS

J. C. Slonczewski, "Conductance and exchange coupling of two ferromagnets seperated by a tunneling barrier," 1989 The American Physical Society, Phys. Rev. B, vol. 39, No. 10, Apr. 1, 1989, pp. 6995-7002.

Jiang et al., "Pulse Stress Testing for Ultra-thin MgO Barrier Magnetic Tunnel Junctions," 29th Electrical Overstress/Electrostatic Discharge Symposium, Sep. 16-21, 2007, EOS/ESD, pp. 1-6.

* cited by examiner

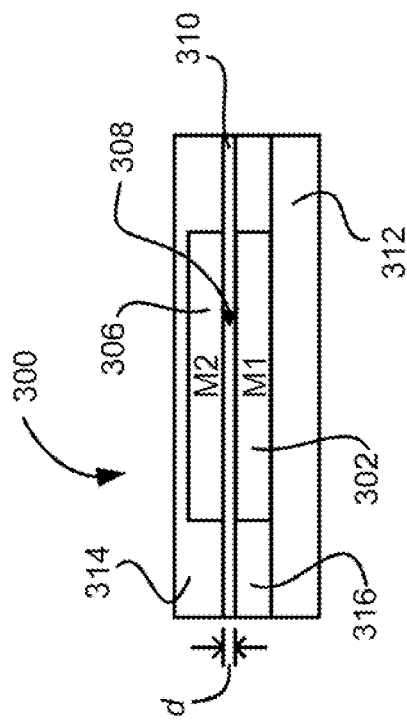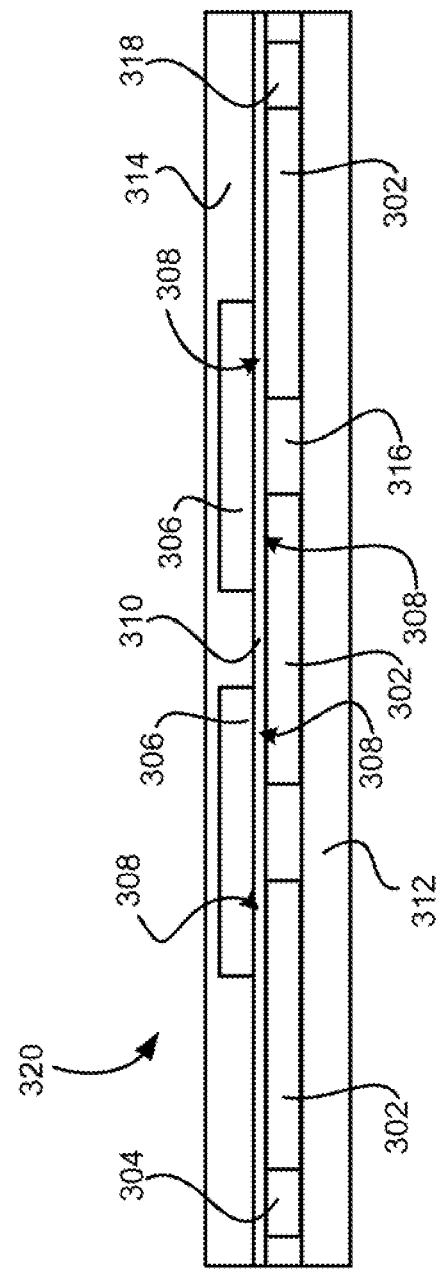

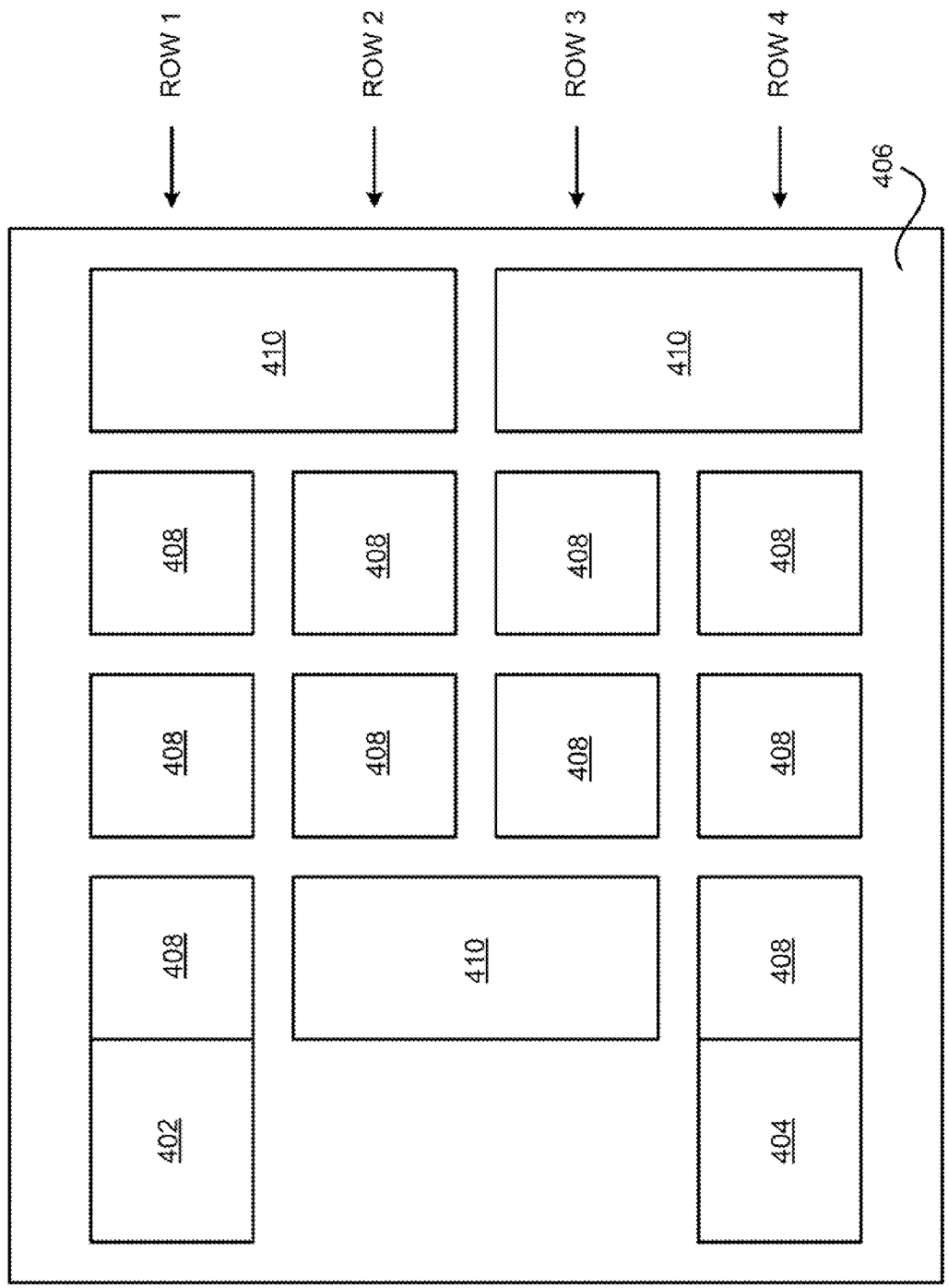

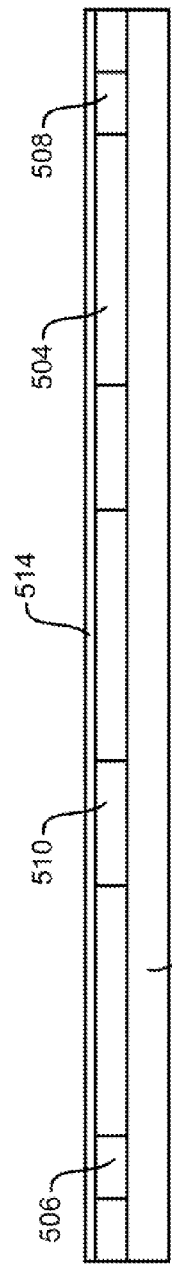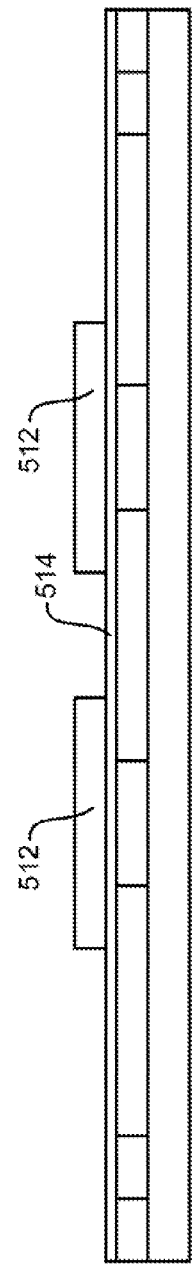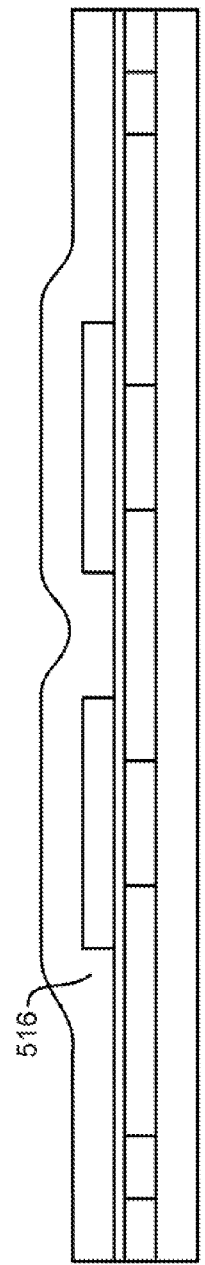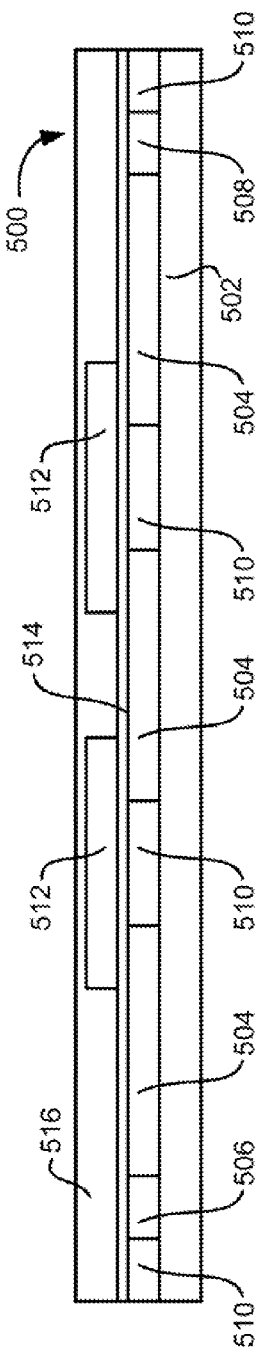

TUNNEL JUNCTION RESISTOR FOR HIGH RESISTANCE DEVICES AND SYSTEMS USING THE SAME

BACKGROUND

The present invention relates to resistors, and more particularly, this invention relates to tunnel junction resistors used with semiconductor and magnetic storage systems.

In magnetic storage systems, data is read from and written onto magnetic recording media utilizing magnetic transducers commonly. Data is written on the magnetic recording media by moving a magnetic recording transducer to a position over the media where the data is to be stored. The magnetic recording transducer then generates a magnetic field, which encodes the data into the magnetic media. Data is read from the media by similarly positioning the magnetic read transducer and then sensing the magnetic field of the magnetic media. Read and write operations may be independently synchronized with the movement of the media to ensure that the data can be read from and written to the desired location on the media.

An important and continuing goal in the data storage industry is that of increasing the density of data stored on a medium. For tape storage systems, that goal has lead to increasing the track density on recording tape, and decreasing the thickness of the magnetic tape medium. However, the development of small footprint, higher performance tape drive systems has created various problems in the design of a tape head assembly for use in such systems.

Circuits using semiconductor devices and magnetic storage devices utilize inductive writers and/or readers which are fabricated on the wafer to write data to and read data from the magnetic storage media. These writers and readers can be either external to the wafer or can be thin film resistors deposited onto the wafer. The thin film readers on a wafer are sensitive to electrostatic discharge (ESD) damage.

The readers typically include magnetoresistive (MR) sensors comprising thin film sheet resistors that are highly susceptible to damage from ESD, either through Joule heating from high currents or from dielectric breakdown. The writers are inductive, and alone are much less susceptible to ESD damage from high currents because they are built to sustain high writer currents. However, a typical HDD or tape MR transducer head comprises a piggyback structure, wherein components of each reader and writer are separated by one or more relatively thin insulation layers such as oxide layers. The reader and writer are encapsulated by a substrate and a closure. The writer is stacked above or below the reader vertically in thin film layers.

The insulation layers between the readers and writers are susceptible to dielectric breakdown with damaging electric field levels on the order of $1 \times 10^8$ to $2 \times 10^8$ V/m. One specific failure mode that takes place in the piggyback structured head is shorting between the reader and writer within the same transducer element. For an insulation layer thickness of 0.6 microns, a voltage differential of 60-120 V will result in dielectric breakdown leading to ESD failure and resulting damage. Furthermore, ESD damage to GMR and TMR sensors can occur with voltages as low as 0.5 to 1 V.

ESD damage is a detractor for production yield during the transducer head manufacturing process. ESD damage can manifest in MR sensor resistance value as over high limit (OHL), as under low limit resistance (ULL) measurement and any value in-between. Subtle ESD damage can also be magnetic in nature and may not be readily observable as a change in resistance. The likelihood of shorting events between readers and writers due to ESD can be as high as the typical OHL failure mode. Extant tape heads contain upwards of 30 to 40 reader-writer pairs per tape head, such that a per-transducer loss as low as 0.1% translates to a large loss of 3 to 4% loss of tape heads.

One approach to preventing ESD damage is to connect neighboring reader and/or writers together to maintain an equipotential. However, space on the device is at a premium, and most devices do not have room for a shunt having the appropriate resistance. This is particularly so in a device having multiple readers and/or writers, such as in a tape head. For example, for common metals used for thin film resistors, resistances of 10 kΩ and higher utilize large aerial real estate on the wafer. For a standard thin film resistor, the resistance is given by:

$$R = \frac{\rho * L}{H * D} \qquad \text{Equation 1}$$

where ρ is the material resistivity, L is the length of the film, H the height, and D the thickness of the material. Taking Tantalum (Ta) as an example, with a resistivity of $\rho_{Ta}=13 \times 10^{-8}$ Ω-m, and a value of 100 nm for D, a 100 nm for H, for a resistance of 100 kΩ, the value of L would be 7.7 mm. Even dropping H and D to 10 nm each, L would be 77 mm. For many situations, this length utilizes a large amount of area on a wafer. Furthermore, the long leads could act as an antenna to adversely couple into radio frequency (RF) signals. Thin film, high impedance, resistors are used in MR heads used for tape and disk drive storage. A major problem for the tape heads is the large amount of a real space taken up by the thin film, high impedance resistors. Therefore, a resistor which occupies less a real space for use with high resistance devices is desirable.

SUMMARY

A device in one embodiment includes a plurality of tunnel junction resistors coupled in series; a first lead coupled to one end of the plurality of tunnel junction resistors coupled in series; and a second lead coupled to another end of the plurality of tunnel junction resistors coupled in series.

A device in another embodiment includes a magnetoresistive sensor; a plurality of tunnel junction resistors coupled in series; a first lead coupling one end of the magnetoresistive sensor to one end of the plurality of tunnel junction resistors coupled in series; and a second lead coupling another end of the magnetoresistive sensor to another end of the plurality of tunnel junction resistors coupled in series.

A system in yet another embodiment includes a semiconductor device; a plurality of tunnel junction resistors coupled in series; a first lead coupling one end of the semiconductor device to one end of the plurality of tunnel junction resistors coupled in series; and a second lead coupling another end of the semiconductor device to another end of the plurality of tunnel junction resistors coupled in series.

Any of these embodiments may be implemented in a magnetic data storage system such as a tape drive system, which may include a magnetic head as recited above, a drive mechanism for passing a magnetic medium (e.g., recording tape) over the magnetic head, and a controller electrically coupled to the magnetic head.

Other aspects and embodiments of the present invention will become apparent from the following detailed description, which, when taken in conjunction with the drawings, illustrate by way of example the principles of the invention.

BRIEF DESCRIPTION OF THE SEVERAL VIEWS OF THE DRAWINGS

FIG. 7A is a simplified schematic of a tunnel junction resistor according to one embodiment.

FIG. 7B is a simplified schematic of a 4-tunnel junction resistor system according to one embodiment.

FIG. 8A is a simplified schematic of a lower portion of a tunnel junction resistor system according to one embodiment.

FIGS. 9A-9H are simplified schematic drawings showing steps in an exemplary manufacturing process for creating a tunnel junction resistor system according to one embodiment.

DETAILED DESCRIPTION

Figure 1:
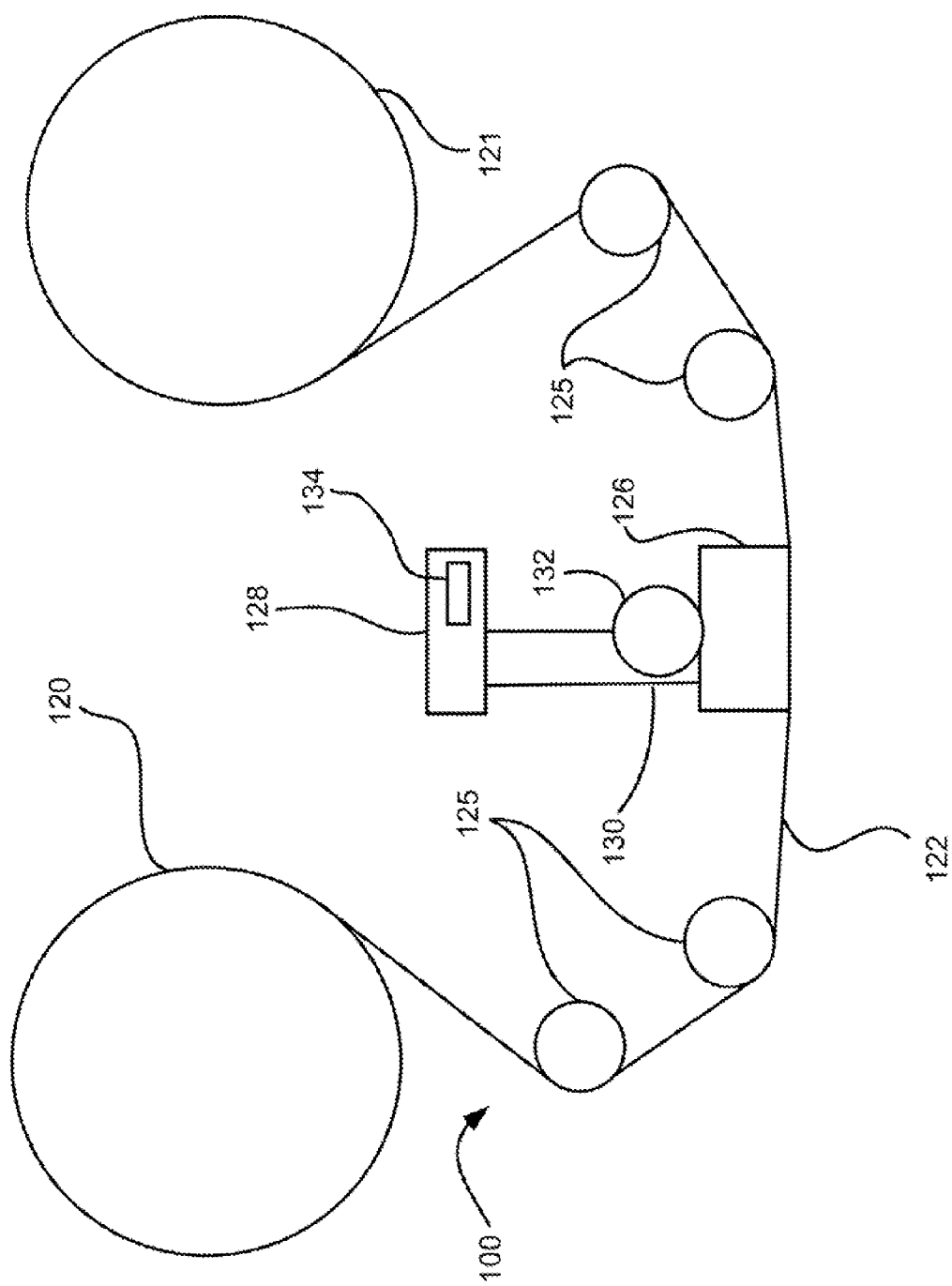
FIG. 1 is a schematic diagram of a simplified tape drive system according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of electronic systems, as well as operation and/or component parts thereof. Particularly, some embodiments include a series of tunnel junction resistors coupled in series, which may be used as a high impedance shunt between elements on a wafer containing multiple elements of readers and/or writers for ESD protection. An advantage of a tunnel junction resistor is that it is easy to fabricate a high impedance shunt, e.g., >300 ohms, or even 100 kohm or 1 Mohm or greater, since the resistance of a tunnel junction increases exponentially with the thickness of the insulating layer of the tunnel junction. Further, using the techniques described herein, highly reliable high impedance shunts can be formed within a very small area, making them particularly suitable for devices where wafer real estate is limited, such as in magnetic heads and other devices.

In one general embodiment, a resistive device comprises a plurality of tunnel junction resistors coupled in series; and a first lead coupled to one end of the plurality of tunnel junction resistors coupled in series; and a second lead coupled to another end of the plurality of tunnel junction resistors coupled in series. A resistive device which is formed by a plurality of tunnel junction elements which are connected in series has a combined resistance and break down voltage which are the sum of the resistances and break down voltages of the individual tunnel junction elements.

In another general embodiment, a device comprises a magnetoresistive sensor; a plurality of tunnel junction resistors coupled in series; and a first lead coupling one end of the magnetoresistive sensor to one end of the plurality of tunnel junction resistors coupled in series; and a second lead coupling another end of the magnetoresistive sensor to another end of the plurality of tunnel junction resistors coupled in series.

In yet another general embodiment, a system includes a semiconductor device; a plurality of tunnel junction resistors coupled in series; a first lead coupling one end of the semiconductor device to one end of the plurality of tunnel junction resistors coupled in series; and a second lead coupling another end of the semiconductor device to another end of the plurality of tunnel junction resistors coupled in series.

FIG. 1 illustrates a simplified tape drive 100 of a tape-based data storage system, which may be employed in the context of the present invention. While one specific implementation of a tape drive is shown in FIG. 1, it should be noted that the embodiments described herein may be implemented in the context of any type of tape drive system.

As shown, a tape supply cartridge 120 and a take-up reel 121 are provided to support a tape 122. One or more of the reels may form part of a removable cassette and are not necessarily part of the system 100. The tape drive, such as that illustrated in FIG. 1, may further include drive motor(s) to drive the tape supply cartridge 120 and the take-up reel 121 to move the tape 122 over a tape head 126 of any type.

Guides 125 guide the tape 122 across the tape head 126. Such tape head 126 is in turn coupled to a controller assembly 128 via a cable 130. The controller 128 typically controls head functions such as servo following, writing, reading, etc. The cable 130 may include read/write circuits to transmit data to the head 126 to be recorded on the tape 122 and to receive data read by the head 126 from the tape 122. An actuator 132 controls position of the head 126 relative to the tape 122.

An interface may also be provided for communication between the tape drive and a host (integral or external) to send and receive the data and for controlling the operation of the tape drive and communicating the status of the tape drive to the host, all as will be understood by those of skill in the art.

Figure 2:
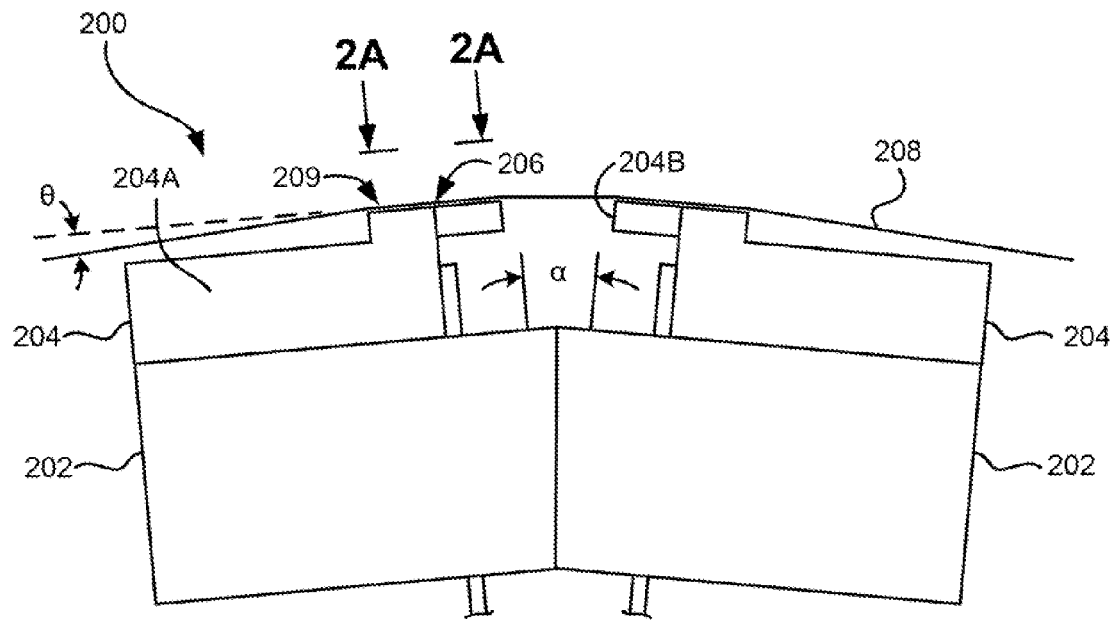
FIG. 2 illustrates a side view of a flat-lapped, bi-directional, two-module magnetic tape head according to one embodiment.

By way of example, FIG. 2 illustrates a side view of a flat-lapped, bi-directional, two-module magnetic tape head 200 which may be implemented in the context of the present invention. As shown, the head includes a pair of bases 202, each equipped with a module 204, and fixed at a small angle α with respect to each other. The bases are typically "U-beams" that are adhesively coupled together. Each module 204 includes a substrate 204A and a closure 204B with a gap 206 comprising readers and/or writers situated therebetween. In use, a tape 208 is moved over the modules 204 along a media (tape) bearing surface 209 in the manner shown for reading and writing data on the tape 208 using the readers and writers. The wrap angle θ of the tape 208 at edges going onto and exiting the flat media support surfaces 209 are usually between ⅛ degree and 4½ degrees.

The substrates 204A are typically constructed of a wear resistant material, such as a ceramic. The closures 204B made of the same or similar ceramic as the substrates 204A.

The readers and writers may be arranged in a piggyback configuration. The readers and writers may also be arranged in an interleaved configuration. Alternatively, each array of channels may be readers or writers only. Any of these arrays may contain one or more servo readers.

Figure 2A:
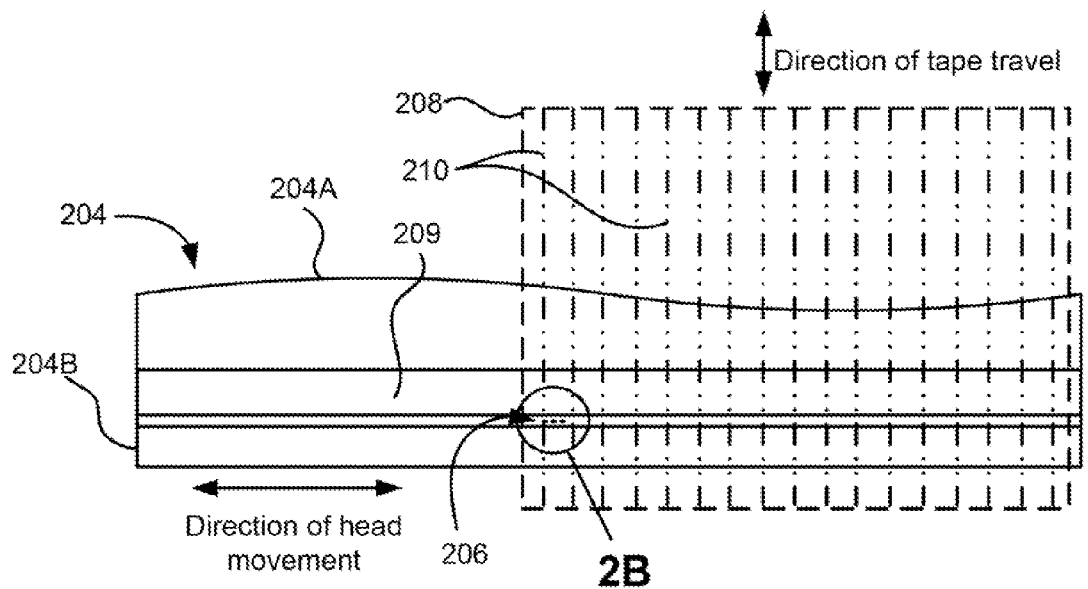
FIG. 2A is a tape bearing surface view taken from Line 2A of FIG. 2.

FIG. 2A illustrates the tape bearing surface 209 of one of the modules 204 taken from Line 2A of FIG. 2. A representative tape 208 is shown in dashed lines. The module 204 is preferably long enough to be able to support the tape as the head steps between data bands.

In this example, the tape 208 includes 12-22 data bands, e.g., with 16 data bands and 17 servo tracks 210, as shown in FIG. 2A on a one-half inch wide tape 208. The data bands are defined between servo tracks 210. Each data band may include a number of data tracks, for example 96 data tracks (not shown). During read/write operations, the elements 206 are positioned within one of the data bands. Outer readers, sometimes called servo readers, read the servo tracks 210. The servo signals are in turn used to keep the elements 206 aligned with a particular track during the read/write operations.

Figure 2B:
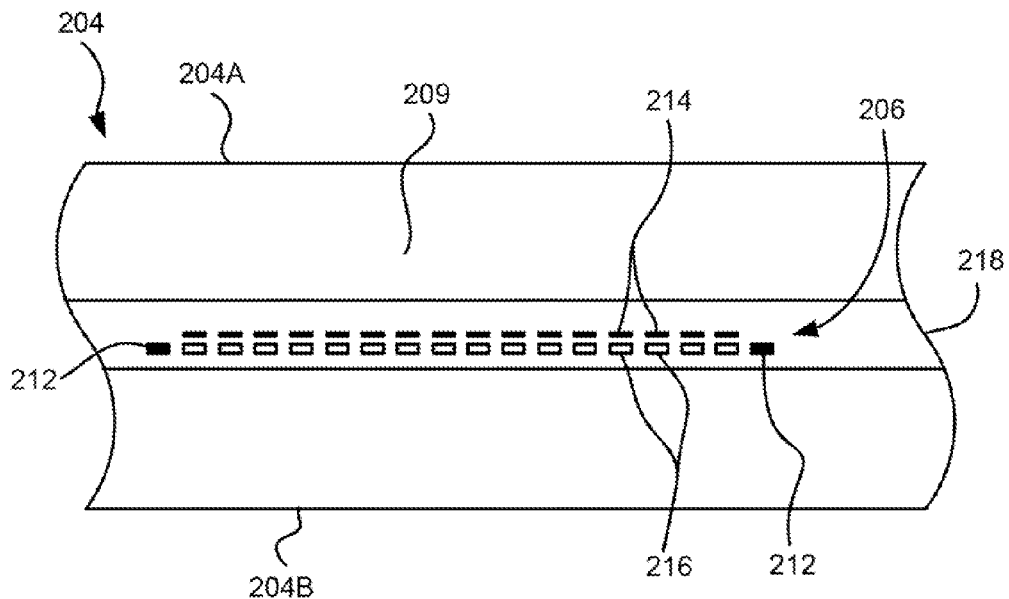
FIG. 2B is a detailed view taken from Circle 2B of FIG. 2A.

FIG. 2B depicts a plurality of read and/or write elements 206 formed in a gap 218 on the module 204 in Circle 2B of FIG. 2A. As shown, the array of elements 206 includes, for example, 16 writers 214, 16 readers 216 and two servo readers 212, though the number of elements may vary. Illustrative embodiments include 8, 16, 32, and 40 elements per array 206. A preferred embodiment includes 32 readers per array and/or 32 writers per array. This allows the tape to travel more slowly, thereby reducing speed-induced tracking and mechanical difficulties. While the readers and writers may be arranged in a piggyback configuration as shown in FIG. 2B, the readers 216 and writers 214 may also be arranged in an interleaved configuration. Alternatively, each array of elements 206 may be readers or writers only, and the arrays may contain one or more servo readers 212. As noted by considering FIGS. 2 and 2A-B together, each module 204 may include a complementary set of elements 206 for such things as bi-directional reading and writing, read-while-write capability, backward compatibility, etc.

Figure 2C:
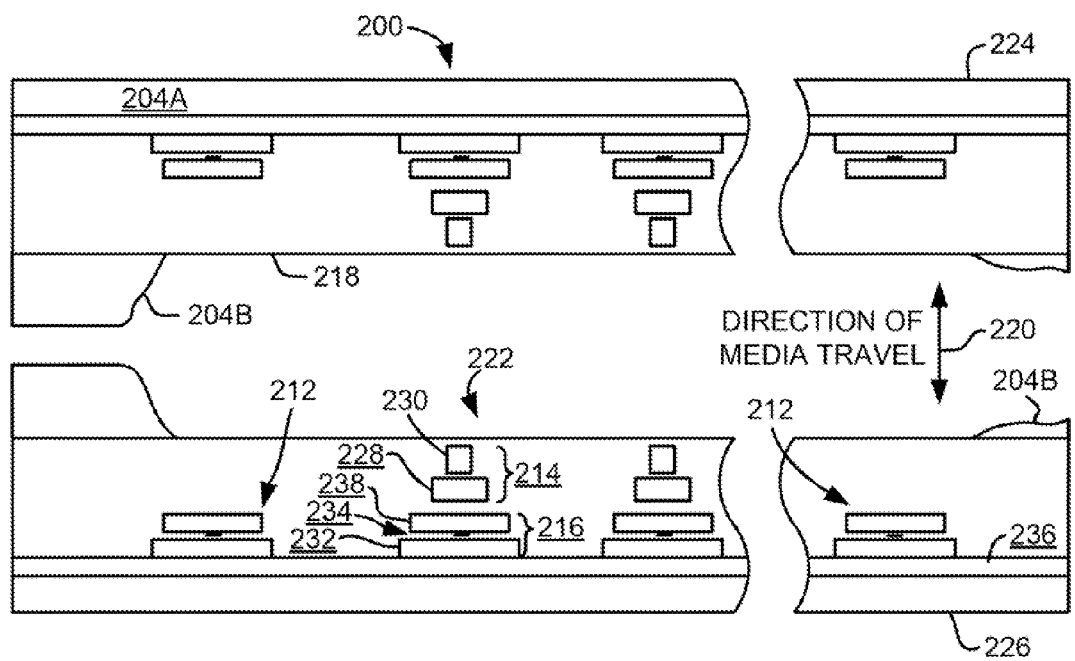
FIG. 2C is a detailed view of a partial tape bearing surface of a pair of modules.

FIG. 2C shows a partial tape bearing surface view of complimentary modules of a magnetic tape head 200 according to one embodiment. In this embodiment, each module has a plurality of read/write (R/W) pairs in a piggyback configuration formed on a common substrate 204A and an optional electrically insulative layer 236. The writers, exemplified by the write head 214 and the readers, exemplified by the read head 216, are aligned parallel to a direction of travel of a tape medium thereacross to form an R/W pair, exemplified by the R/W pair 222.

Several R/W pairs 222 may be present, such as 8, 16, 32 pairs, etc. The R/W pairs 222 as shown are linearly aligned in a direction generally perpendicular to a direction of tape travel thereacross. However, the pairs may also be aligned diagonally, etc. Servo readers 212 are positioned on the outside of the array of R/W pairs, the function of which is well known.

Generally, the magnetic tape medium moves in either a forward or reverse direction as indicated by arrow 220. The magnetic tape medium and head assembly 200 operate in a transducing relationship in the manner well-known in the art. The piggybacked MR head assembly 200 includes two thin-film modules 224 and 226 of generally identical construction.

Modules 224 and 226 are joined together with a space present between closures 204B thereof (partially shown) to form a single physical unit to provide read-while-write capability by activating the writer of the leading module and reader of the trailing module aligned with the writer of the leading module parallel to the direction of tape travel relative thereto. When a module 224, 226 of a piggyback head 200 is constructed, layers are formed in the gap 218 created above an electrically conductive substrate 204A (partially shown), e.g., of AlTiC, in generally the following order for the R/W pairs 222: an insulating layer 236, a first shield 232 typically of an iron alloy such as NiFe (permalloy), CZT or Al—Fe—Si (Sendust), a sensor 234 for sensing a data track on a magnetic medium, a second shield 238 typically of a nickel-iron alloy (e.g., 80/20 Permalloy), first and second writer pole tips 228, 230, and a coil (not shown).

The first and second writer poles 228, 230 may be fabricated from high magnetic moment materials such as 45/55 NiFe. Note that these materials are provided by way of example only, and other materials may be used. Additional layers such as insulation between the shields and/or pole tips and an insulation layer surrounding the sensor may be present. Illustrative materials for the insulation include alumina and other oxides, insulative polymers, etc.

In various embodiments, resistor systems are used in semiconductor systems and electronic systems, including those mentioned above. It should be kept in mind that the teachings herein are applicable to any electronic or semiconductor system of any type, including but not limited to thin film sensors, amplifiers, microprocessors, counters, rectifiers, power supply components, etc.

In one approach, shunts for magnetoresistive (MR) heads, including readers and writers, for protecting against electrostatic discharge between readers and writers therein are provided. In one embodiment of the present invention, a shunt comprises a high impedance (high resistance) shunt formed of a plurality of tunnel junction resistors coupled in series, the shunt reducing the occurrence of electrostatic discharge in MR heads by equalizing the relative charge potential between the readers and writers in an MR head when electrically un-powered (i.e., not coupled to an electrical power source). The high impedance shunt provides a high impedance conductive path for maintaining electrostatic charge equipotential between the reader elements and/or the writer elements when isolated from a measuring device, but provides sufficient electrical isolation during measurements and operation.

When at least one of the leads is connected to an external electrical contact point, such as a ground point, the uniform distribution of negative charge in the leads dissipate to equalize the lead potential. An additional high impedance shunt may also be disposed between common points where the reader and writers are connected together and an external electrical contact point. This additional high impedance shunt is preferably selected to limit the current dissipated to the external contact point while forming the common contact between the readers and writers and the external device.

An example implementation is described below for an MR head assembly comprising read/write transducers utilizing MR read sensors, such as a piggyback MR head for tape storage drives. Generally, a piggyback magnetic head assembly includes an MR read assembly (reader) and an inductive write assembly (writer) formed as a piggyback structure. As noted, a piggyback structure is one where a writer is physically located above or below a reader in the wafer processing. In the piggyback structure, the reader elements and the writer coils are separated by a thin oxide layer which is susceptible to damage by dielectric breakdown if the voltage of the readers and writers exceeds the damage threshold of the insulating material. The MR could be an anisotropic (A) MR, a giant (G) MR, or a tunneling (T) MR. However, the present invention is not limited to MR sensors. As such, the reader can be any sensitive device which is located sufficiently close to another device (a writer in this example) where the separation between the two devices is small enough to result in a dielectric breakdown between the two devices at some voltage level that may be encountered during device fabrication, processing, testing, installation, etc.

To prevent a build up of potential differences between readers and writers, each conductive lead to the readers and writers may be electrically connected to a high impedance shunt comprising a plurality of tunnel junction resistors coupled in series. The resistors are electrically connected together and in one example are also connected to a common electrical point. The resistors and/or resistor systems can have different values, same values, or a combination thereof, to satisfy certain criteria in preventing against electrostatic discharge (ESD).

Additionally, the use of a plurality of tunnel junction resistors coupled in series provides a higher breakdown voltage for each shunt resistor system. For example, assume each individual tunnel junction resistor has a dielectric breakdown of 0.5 to 1.0 V. This is in the vicinity of, and even less than, the breakdown voltages of some types of MR sensors. For instance, some AMR sensors have a breakdown voltage of about 3 to 6 V. Therefore, single tunnel junction resistors may afford limited ESD protection. With 20 tunnel junction resistors coupled in series, the breakdown voltage of the overall system is increase to 10 to 20 V. In various embodiments, the breakdown voltage may be at least about 4V, at least about 8V, at least about 20 V, etc.

Figure 3:
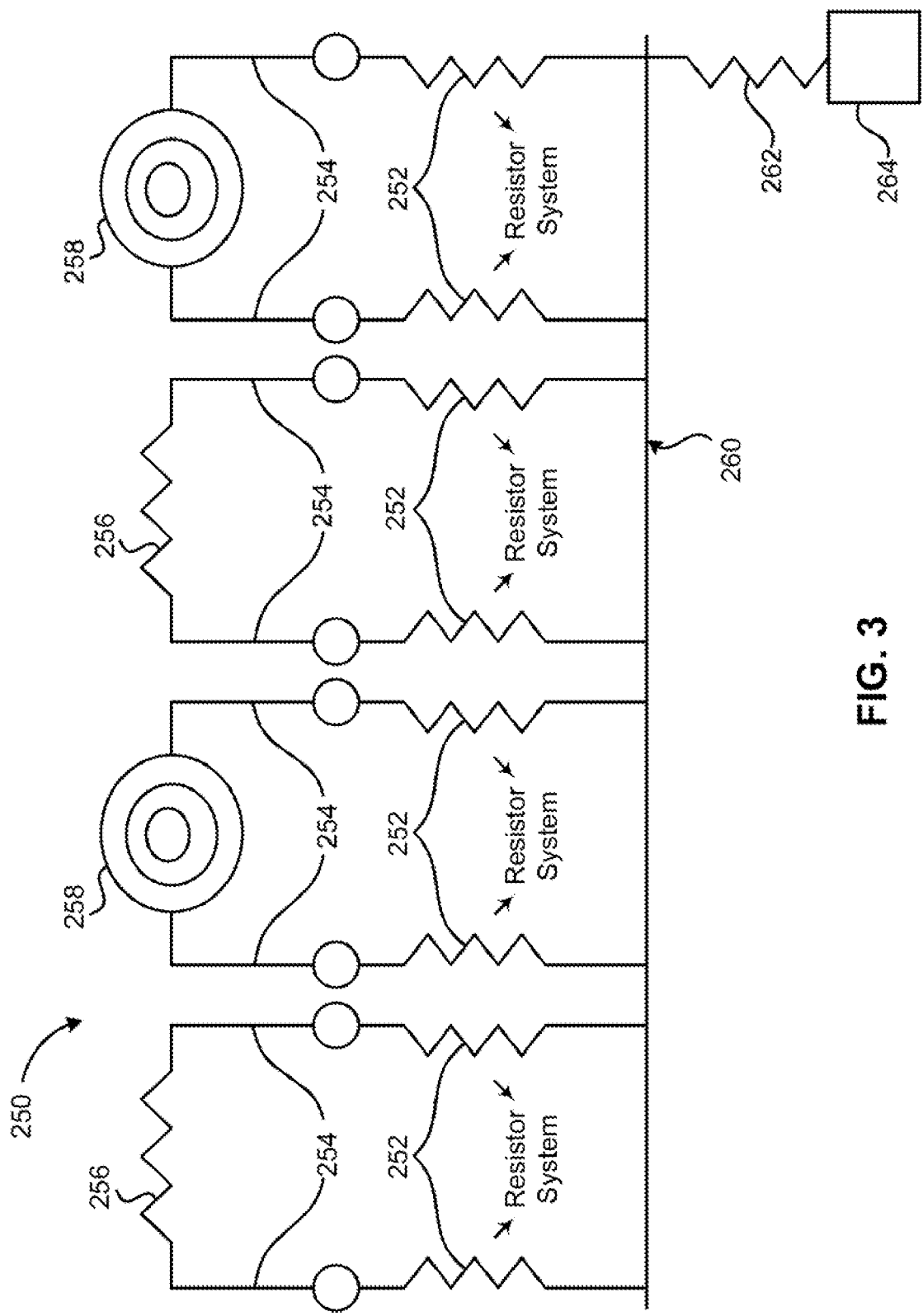
FIG. 3 shows an example shunt circuit of discrete high impedance shunts for an MR transducer head assembly, according to an embodiment of the present invention.

FIG. 3 shows a schematic of an example shunt circuit 250 including discrete shunt resistor systems 252, where each shunt resistor system includes a series of tunnel junction resistors in series, for a high impedance shunt in an MR head having multiple leads 254 for readers 256 and writers 258, according to the present invention. Again, the shunt resistor systems 252 may be formed on the wafer on which the readers 256 and writers 258 are constructed, but could also be coupled to a cable. Each discrete shunt resistor system 252 is connected in series with a lead 254, and the resistors 252 are electrically connected together via a common electrically conductive path 260, to bring the readers 256 and writers 258 into equipotential.

An additional high impedance resistive element 262 may be utilized, with a first end of the additional resistive element connected to the common point (e.g., common path 260) on the head or cable connecting the readers and writers, and a second end of the additional resistive element connected to the external common electrical contact point 264. This additional resistive element 262 limits the current flow between the readers and writers and the external device during first contact. In one example, the second end of the additional resistive element 262 is connected to the external ground of a tester or device to which the transducer elements are to be connected to allow the potentials of the transducer elements to equilibrate to the potential of the external device, thereby reducing the chance of ESD and resulting damage while connecting the transducer elements to an external device. As such, the common path 260 is connected to an external common electrical contact point 264, such as ground, through a resistor 262 to allow discharge of the electrostatic charge accumulated in the readers/writers through the leads 254 and the high impedance shunt resistor systems 252 to the contact point 264 via the common path 260.

The high impedance of the shunt resistor systems 252 controls the time dependence of the discharge of accumulated electrostatic charge between the readers and writers while the resistor 262 controls the time dependence of the discharge to the external contact.

The shunt circuit protects the readers 256 against OHL type of ESD failure, and protects against ESD between the readers 256 and writers 258, such as dielectric breakdown. The shunt resistor systems 252 are of sufficiently high impedance to not interfere with resistance measurements of the readers 256 and writers 258 or their normal operation. Further, the shunt resistor systems 252 are of sufficiently low impedance to provide ESD protection. The tunnel junction resistors 252 provide protection against ESD damage during manufacturing processes by enabling a slow enough charge transfer to avoid ESD damage while connecting the elements to external testers. At the same time, the resistance values of the tunnel junction resisters are high enough to not interfering with other electrical tests of the readers and writers during tests in the manufacturing process or during their normal read/write functions.

The high impedance shunt resistor systems preferably have resistance values that allow read/write signal measurements via the transducer heads for normal read/write operations with the transducer heads, without requiring removal of the high impedance shunt resistor systems. A criteria for choosing a shunt resistance value ($R_{shunt1}$) of a shunt resistor system 252 for electrically connecting together the transducer elements (i.e., the readers 256 and writers 258) with leads 254 within the chip or the cable coupled thereto, is to maintain an equipotential (i.e., equal potential) voltage between the transducer elements while in the un-powered state during manufacturing, fabrication and assembly processes while not significantly affecting the performance of the transducer elements. To maintain an equipotential between the transducer elements, the shunt resistance should be as low as possible. To maintain the performance of the transducer elements, the shunt resistance should be as high as possible.

As an example, if $R_{shunt1}$ represents the shunt resistance across a transducer element (reader or writer) having a resistance $R_{dut}$, then the ratio ($R_{dut}/R_{shunt1}$) represents the fraction of current which passes through $R_{shunt1}$ rather than through $R_{dut}$, known as leakage current. Such leakage current results in signal loss, degrading the transducer element performance. For MR heads used in tape drives, a 0.1% loss of signal may be acceptable. For AMR, GMR, and TMR reader elements, the resistance values are usually between 10Ω and 400Ω. Thus, acceptable choices for $R_{shunt1}$ for maintaining reader element performance can be, e.g., between about 10 kΩ and about 400 kΩ, with the lower and higher range shunt resistance values being used for the lower and higher resistance values of the reader element. In other embodiments, $R_{shunt1}$ may be higher or lower than the range set forth above, e.g., less than about 10 kΩ, higher than about 400 kΩ, higher than 1 MΩ, etc.

Another criterion for choosing a shunt resistance value involves verification of whether the values of $R_{shunt1}$ are too high to achieve rapid charge equilibration of the different transducer elements. Assume again that the resistor system is on the chip or cable. Electrostatic charging of the cable by tribocharging events, which are mechanical in nature, is slower than a microsecond range and is often in the millisecond range. Typical capacitance values of leads 254 in a cable are of the order of 10 pf. Thus, with shunt resistance $R_{shunt1}$ between 25 kΩ and 400 kΩ, the RC time constant is between 2.5 to 40 ns, allowing the leads 254 to remain at an equipotential voltage during the tribocharging event, which prevents ESD events.

In tape and HDD transducer heads, both readers and writers may be connected via the same cables. The resistance of the writers is usually about 15Ω to 20Ω. As such, the above shunt resistance selection criterion for readers also applies to the writers to prevent internal ESD damage to the readers. Furthermore, adjacent readers and writers typically do not function simultaneously, such that an additional pick-up of the write signals by the readers is not important from a performance perspective. However, it is important to minimize the loss of the write signal through the read leads (lines) and visa versa. A simple calculation shows that a shunt between a reader and a writer of greater than about 10 kΩ does not cause substantial leakage.

In one example, for a writer with an impedance ($R_{write}$), a write current ($I_{write}$) and a high impedance shunt resistance ($R_{shunt1}$), the leakage current from the writer to the reader is of the order of $I_{write} \times (R_{write}/R_{shunt1})$. For an $R_{write}$ of 20Ω and an $R_{shunt1}$ of 10 kΩ, the leakage current into the reader is 0.2% of the write current. For an $I_{write}$ of 20 mA, the leakage current would be 0.04 mA, which would not cause damage to a typical MR sensor used in the magnetic media storage industry. In one example, where the readers have a resistance of about 50 to 150Ω, and the writers have a resistance of about 10 to 35Ω, each resistor system 252 can comprise a resistor with a value of about 100 kΩ.

Another component typically used in a tape drive head is a servo, which is an MR reader used to align the readers and writers on the proper track on the tape. In HDD devices, the reader serves as the servo. The servos are sensitive to ESD damage and preferably also include charge dissipative shunt connections ($R_{shunt1}$). Although some tape products do same-gap-servo tracking so that the servos are reading data at the same time as the writers on the same cabled module are operating, since the servos operate at a frequency outside the range of the writers, the writer leakage can be further suppressed, through the use of filters.

Figure 4:
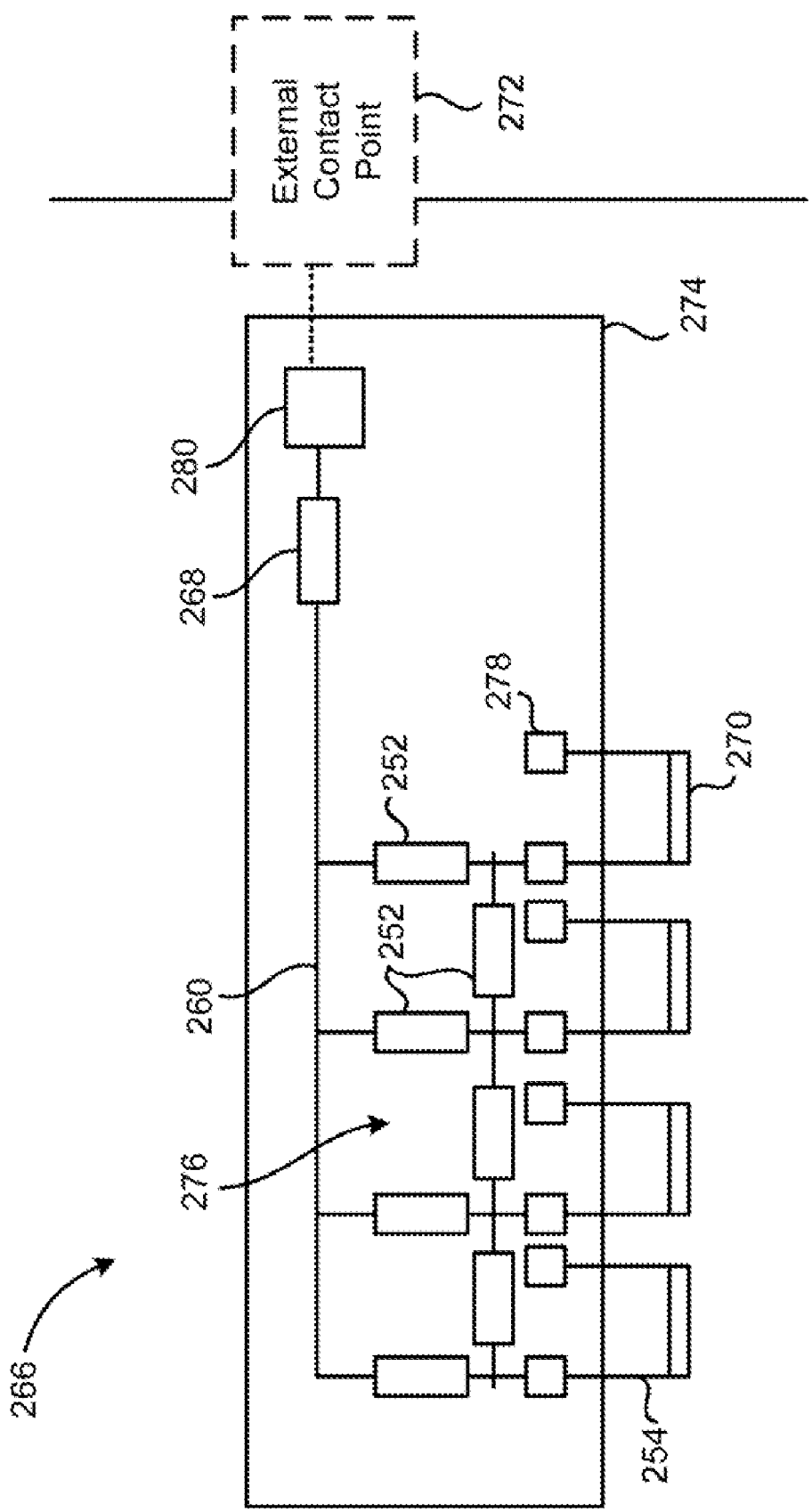
FIG. 4 shows an example shunt circuit of a high impedance bus bar shunt for an MR transducer head assembly, according to an embodiment of the present invention.

Referring to FIG. 4, in addition to the shunt resistor systems 252, a shunt circuit 266 according to another implementation of the present invention includes a shunt resistor 268 with a resistance value $R_{shunt2}$, for connecting the transducer elements 270 (i.e., readers 256 and writers 258) to an external device 272 such as a continuity tester for electrical measurements. The shunt resistor 268 may be a single resistor, series of resistors, etc., and preferably includes one or more tunnel junction resistors. The shunt resistor systems 252 are connected in a conductive bus bar configuration 276, and the resistor 268 is optionally located on the cable 274 in order to minimize the capacitance between the transducer elements and the resistor 268. The bus bar comprises strips of electrically conductive material which are of high impedance, shown as high impedance resistive elements 252 in FIG. 4. The shunt circuit 266 further includes transducer element contact pads 278 and an external device contact pad 280.

The value $R_{shunt2}$ is selected to minimize the current through, or the voltage across, the transducer elements. Modeling the shunt circuit as a simple resistor-capacitor circuit (RC circuit) of capacitance C, dissipative resistance $R_{shunt2}$ and transducer element 270 resistance $R_{dut} \ll R_{shunt2}$ then the RC time constant for dissipation can be represented as $\tau_{RC} \sim CR_{shunt2}$. For a voltage difference V between the cable 274 and an external device, the electrostatic charge ($Q_o$) on the cable 274 is the mathematical product of C and V.

The peak current ($I_{peak}$) through the transducer element, then is: $I_{peak} = Q_o/\tau_{RC} = V/R_{shunt2}$. The peak voltage ($V_{peak}$) across the transducer element 270 of resistance $R_{dut}$ then would be: $V_{peak} = V(R_{dut}/R_{shunt2})$ which drops the value of the voltage differential by the ratio of the device resistance to the shunt resistance $R_{shunt2}$, indicating as high a value for $R_{shunt2}$ as possible for protection against ESD. The upper limit of $R_{shunt2}$, then would be from a practical value for testing purposes (time constant, $\tau_{RC}$, short duration). Assuming that the cable capacitance is substantially lower than the external test device capacitance, the cable 274 will reach the test device voltage within a time $\tau_{RC}$. With an external device resistance of 100Ω, and a value of 10 pf for C, then $R_{shunt2}$ values of 100 kΩ to 10 MΩ would yield voltage protection suppressions of between a factor of 1 k and 100 k, and discharge times of between 1 and 100 microseconds. Thus, example resistance values for $R_{shunt2}$ within this range are reasonable.

Figure 5:
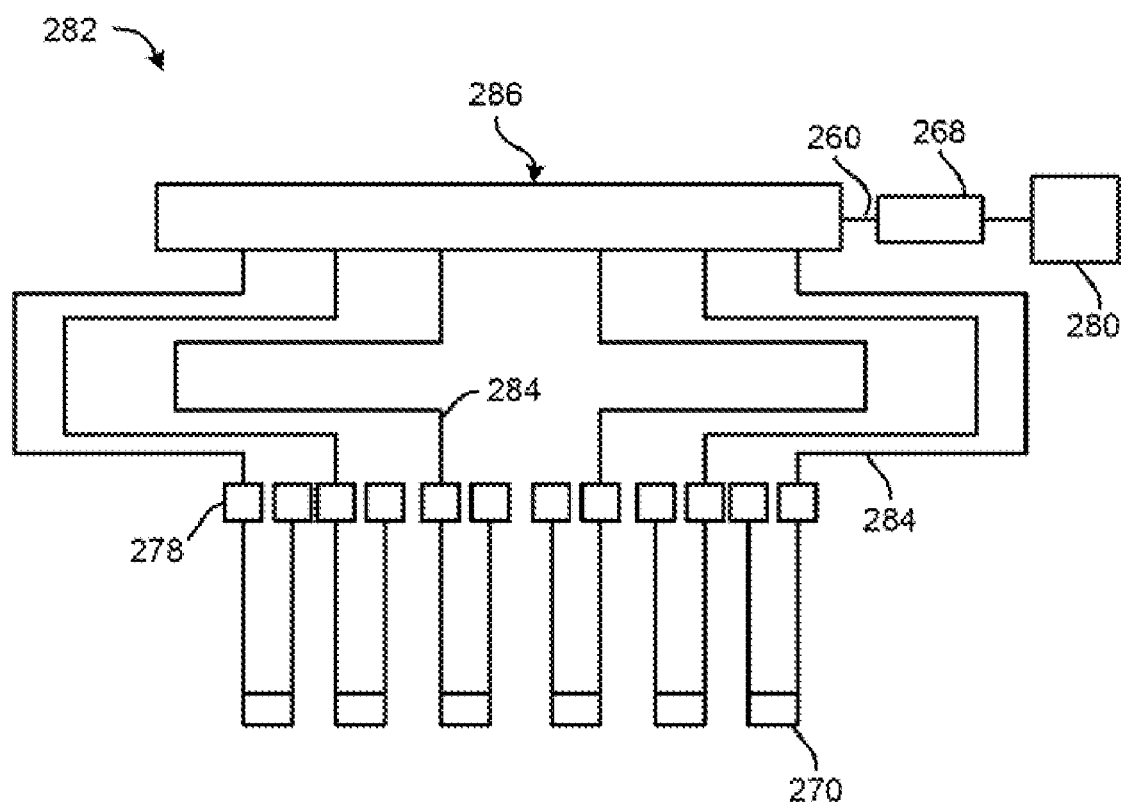
FIG. 5 shows another example shunt circuit of a high impedance bus bar shunt for an MR transducer head assembly, according to an embodiment of the present invention.

FIG. 5 shows another example of a shunt circuit 282 according to one embodiment of the present invention, wherein high impedance shunt resistor systems 284 are used in place of the discrete high impedance shunt resistor systems 252. Each shunt resistor system 284 has a shunt resistance $R_{shunt1}$, and includes a plurality of tunnel junction resistors coupled in series. The shunt resistor systems 284 are connected via a bus bar 286. The shunt circuit 282 also includes the external device shunt resistor 268 with resistance $R_{shunt2}$ as described above.

Figure 6A:
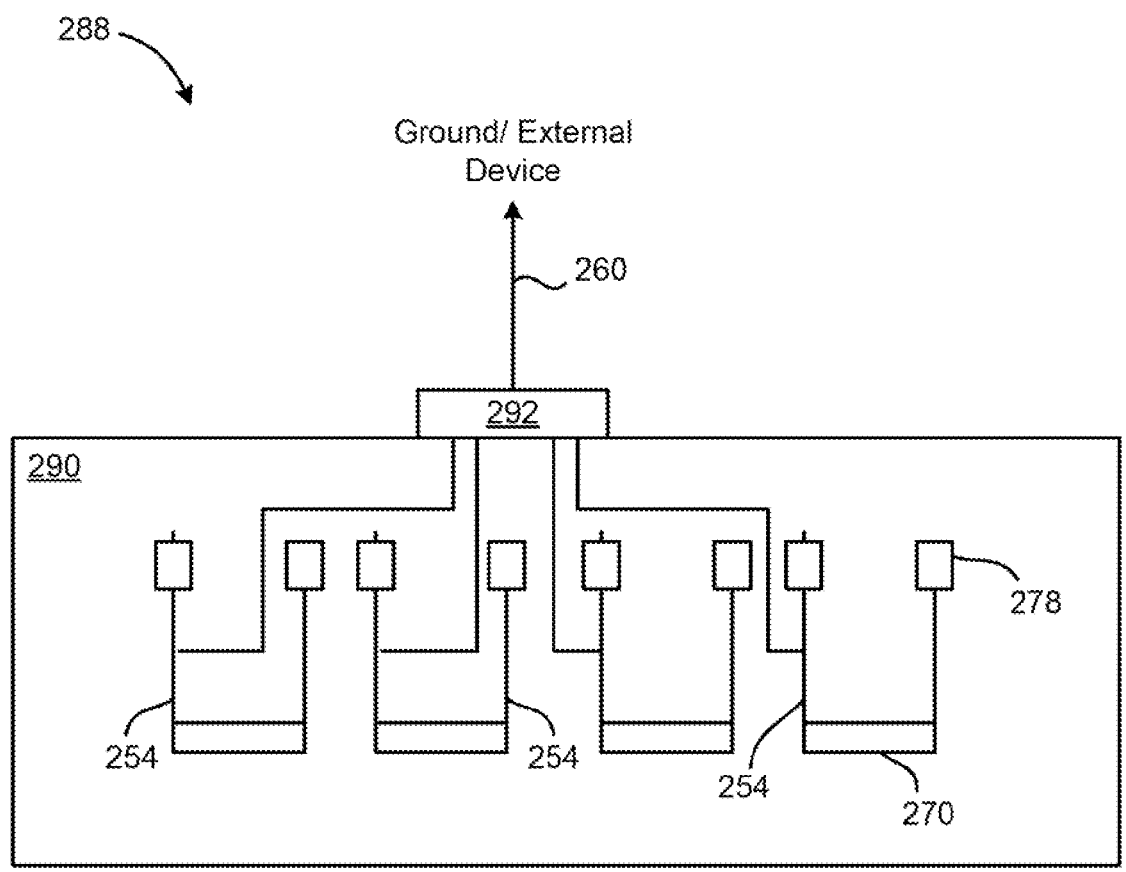
FIGS. 6A and 6B show example placements of the high impedance shunts.

As shown in FIGS. 4 and 5, at least one writer element lead is connected to a high impedance shunt, and at least one reader element lead is connected to a high impedance shunt. In another example head assembly 288 shown in FIG. 6A, shunt resistor systems for a transducer head 290 including transducer elements 270, can be on an external chip 292 which can be bonded to leads 254 of the transducer elements 270, and bonded to the transducer head substrate or piggyback structure. An example would be to fabricate the high impedance shunt resistor systems on the chip 292, each shunt resistor system having a plurality of tunnel junction resistors coupled in series. One advantage of this approach is that if space on the wafer (substrate) containing the transducer elements 270 is at a premium, then the chip 292 can be connected to the transducer 272 at a later stage. Further, the high breakdown voltage afforded by the plurality of tunnel junction resistors coupled in series is provided.

Figure 6B:
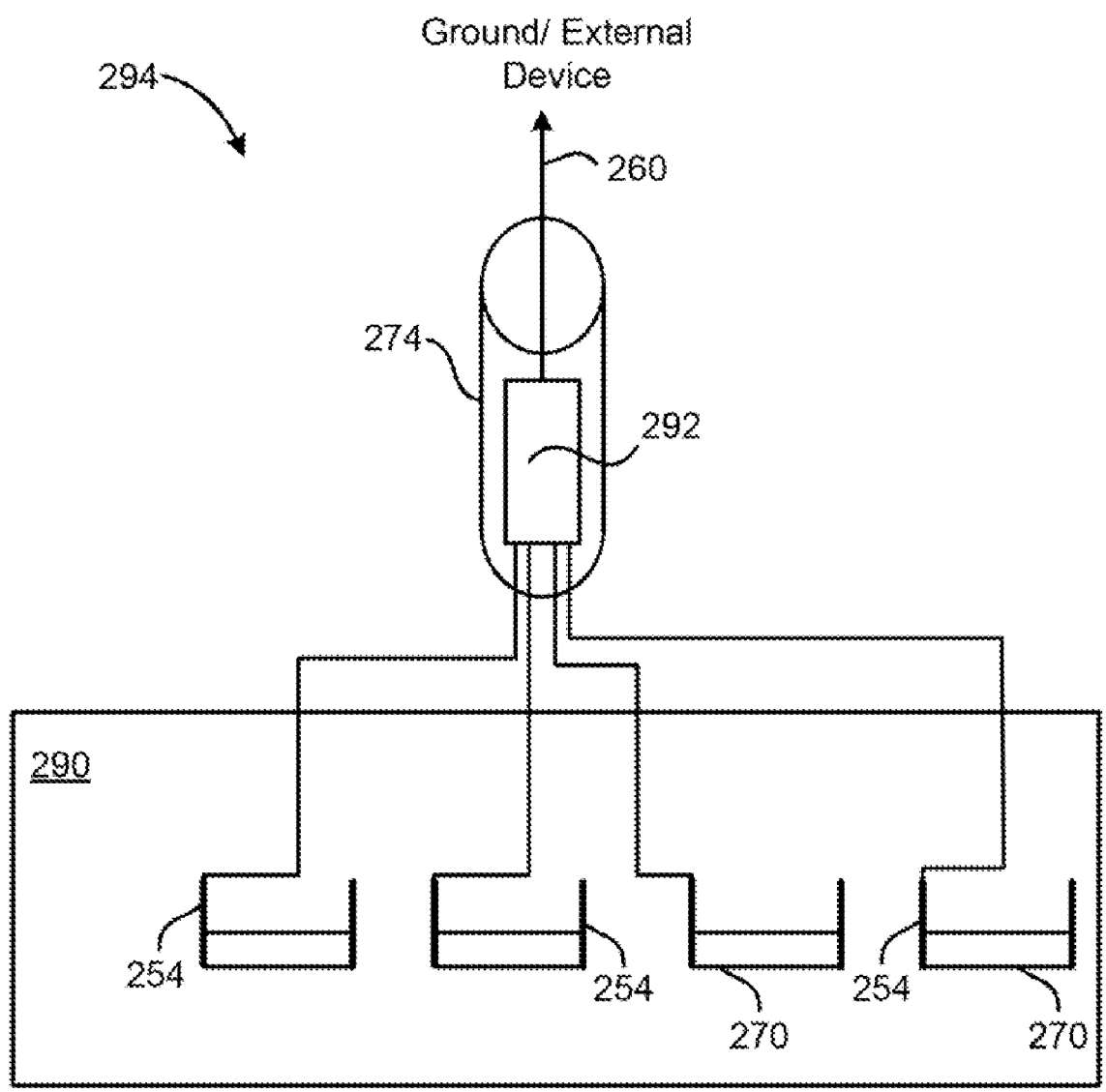

Since much of the ESD damage can occur after the cable containing the leads 254 is attached to the transducer elements 270, in another example head assembly 294 shown in FIG. 6B the chip 292 including the high impedance shunt resistor systems can be bonded to the flexible cable 274 that is attached to the transducer elements 270. An advantage of attaching the shunt resistor systems via the chips 292 at a later stage is that defects in making the shunt resistor systems would not affect the yield of the reader and writer chips. Another advantage of attaching a shunt resistor chip 292 to the cable 274 is that if, for some reason, the processing for the shunt resistor systems is not available at the same facility as the reader-writer fabrication site, then the shunt resistor chip 292 could be added elsewhere. The high impedance resistance is chosen to be high enough not to interfere with the normal operation of the readers and writers or to couple them together. In addition, the add-on high impedance shunt resistor systems can be on a flip chip that can be attached to the cable 274 and removed downstream in the manufacturing process.

A preferred approach to fabricating a high impedance resistor system on a wafer is to use a tunneling junction resistor. FIG. 7A shows a simplified schematic of a tunneling junction resistor 300 according to one embodiment. As FIG. 7A shows, tunneling junction resistors are composed of two metal sheets, M1 302 and M2 306, comprising an area A that are separated by an insulator 310, also known as a tunnel barrier layer, tunneling layer, etc., of thickness d. M1 302 and M2 306 may be the same or different materials, depending on the desired results. Examples of insulators 310 could be alumina ($Al_2O_3$), silica ($SiO_2$), magnesium oxide (MgO), etc. With a voltage differential applied across the two metal sheets M1 302 and M2 306, electrons can tunnel through the insulator 310 from M1 302 to M2 306, or from M2 306 to M1 302, as shown at 308. The two metals 302 and 306 may be surrounded by insulators 316 and 314, respectively. Also, M1 302 may be formed on a substrate 312.

Tunneling is a quantum mechanical phenomenon. The penetration of the wave function from the metal into the insulator determines the function T(L) to first order. A crude calculation of f(L) is to determine the wave function $\psi(x)$ in the insulator to a depth x. The potential in the insulator is taken as a constant U above the metal, and is probably related to the work function of the electrons from the metal into the insulator.

$$(T+U)\psi(x)=\epsilon\psi(x)=(-((hc/2\pi)^2/2mc^2)d^2/d^2x+U)\psi(x) \qquad \text{Equation 2}$$

h is Planck's constant (hc=12,398 eV Angstrom), c ($3.0\times10^8$) is the speed of light in vacuum, m ($mc^2$=0.5 MeV) is the mass of an electron. The solution to Equation 2 is:

$$\psi(x)=\exp(-x/2\lambda) \qquad \text{Equation 3a}$$

with $$\lambda=(hc/4\pi)/(2mc^2(U-\epsilon))^{0.5} \sim (hc/4\pi)/(2mc^2U)^{0.5} \qquad \text{Equation 3b}$$

Note that $\epsilon \sim k_BT$ (about 25 meV), while U is of the order of several eV. T(L) is now given by the probability of the wave function penetrating across the barrier of length L in Equation 4:

$$T(L)=|\psi^2|=\exp(-L/\lambda) \qquad \text{Equation 4}$$

For an arbitrary potential U(x), the tunneling probability is given by Equation 5.

$$T(L)=\exp(-2\int_0^L dx[(2m(U(x)-\epsilon))^{0.5}(h/2\pi)]). \qquad \text{Equation 5}$$

The conductance through a tunnel junction is proportional to T(L), so the resistance ($R_{TJ}$) of a tunnel junction is inversely proportional to T(L), and is given by Equation 6, $$R_{TJ}=R_o/[T(L)HD]=[R_o/HD]\exp(L/\lambda). \qquad \text{Equation 6}$$

where HD is the surface area of the interface and $R_o$ is a property of the tunnel junction materials. To determine the order of magnitude of $\lambda$, U can be taken as a constant of values 1 eV and 4 eV. The corresponding values of $\lambda$ for U values of 1 eV and 4 eV are: 0.1 nm and 0.05 nm, respectively.

As an example, using a value of 0.12 nm for $\lambda$ and $8.4\times 10^{-14}$ $\Omega m^2$ for $R_o$, a high impedance shunt resistor can be constructed using the parameters given in Tables 1 and 2, below.

TABLE 1

Tunnel Junction parameters to achieve resistances from 100 to 1,000,000 ohms. A value of 0.12 nm for $\lambda$ and $8.4 \times 10^{-14}$ $\Omega m^2$ for $R_o$, and an area of $10^{-12}$ $m^2$. The relative permittivity of the insulating area is taken to be 3.

| R | Ohms | 100 | 1,000 | 10,000 | 100,000 | 1,000,000 |
|---|---|---|---|---|---|---|
| L | nm | 0.85 | 1.12 | 1.40 | 1.68 | 2.00 |
| C | (pf) | 0.031 | 0.024 | 0.019 | 0.016 | 0.013 |

TABLE 2

Tunnel Junction parameters to achieve resistances from 100 to 1,000,000 ohms. A value of 0.12 nm for $\lambda$ and $8.4 \times 10^{-14}$ $\Omega m^2$ for $R_o$, and an area of $4 \times 10^{-14}$ $m^2$. The relative permittivity of the insulating area is taken to be 3.

| R | Ohms | 100 | 1,000 | 10,000 | 100,000 | 1,000,000 |
|---|---|---|---|---|---|---|
| L | nm | 0.46 | 0.74 | 1.01 | 1.29 | 1.57 |
| C | (pf) | 0.0023 | 0.0014 | 0.0011 | 0.00083 | 0.00068 |

Another advantage of a tunnel junction resistor is that it has very weak temperature dependence. While metals have a temperature coefficient which is in the order of 0.11 to 0.5%/° K. Tunnel junction resistors have essentially no temperature dependence, since the barrier height is much higher than the thermal energy of the electrons in the metal. Taking U of 600 meV, the $\epsilon$ in Equation 5 at approximately room temperature (about 293° K) is 25 meV. 1° K then would affect the resistance of the tunnel junction according to Equation 7, $$(\Delta R_{TJ}/\Delta T)/R_{TJ}\sim(\Delta\epsilon/\Delta T)/U\sim 0.014\%/° \text{ K} \qquad \text{Equation 7}$$

which is an order of magnitude lower than for conventional thin film resistors.

Another important quantity for a tunnel junction resistor is the capacitance ($C_{TJ}$), which is given by Equation 8:

$$C_{TJ}=\kappa\epsilon_o HD/L, \qquad \text{Equation 8}$$

where $\kappa$ is the dielectric permeability of the insulating layer, and $\epsilon_o$(=$8.9\times10^{-12}$ f/m) is the dielectric permeability in a vacuum. Using a value of 1 $\mu m^2$ for HD, 3 for $\kappa$ and 1 nm for L yields a capacitance of 0.027 pf, which is negligible for frequencies of 1 GHz.

In general, the resistor systems described herein should have a high impedance in both directions (passive), though, one may choose active tunnel junction resistors in some applications where the resistance is different for different polarities of voltage across the tunnel junction.

Thus, from the foregoing, it can be appreciated that very wide ranges of resistances can be achieved with magnetic tunnel junction resistors coupled in series.

One advantage of the tunnel junction resistor over the conventional sheet resistor is that high resistance tunnel junctions are much more compact than conventional sheet resistors. Other advantages are the extremely low inductance, small capacitance, and low thermal coefficient of tunnel junction resistors when compared to conventional sheet resistors.

FIG. 7B shows a tunnel junction resistor system 320 according one embodiment. In FIG. 7B, a plurality of tunnel junction resistors are coupled in series. In this embodiment, several lower metal pieces 302 may be formed above a substrate 312. The lower metal pieces 302 may be separated by an insulator 316. Any insulator may be used, and several examples are alumina ($Al_2O_3$), silica ($SiO_2$), magnesium oxide (MgO), etc. A thin insulator layer 310 is formed between the lower metal pieces 302 and the upper metal pieces 306. The upper metal pieces 306 are offset from the lower metal pieces 302 so that each upper metal piece 306 is above two of the lower metal pieces 302. In this configuration, when a voltage difference is applied across the system, possibly using the first lead 304 and the second lead 318 on either side of the structure, resistance is achieved at each lower to upper metal interface, as indicated by the arrows 308. In FIG. 7B, a common tunnel barrier layer (thin insulator layer 310) is shown, but alternatively each tunnel junction resistor may use a separate tunnel barrier layer, or at least some of the tunnel junction resistors may share a common tunnel barrier layer. The upper metal pieces 306 may have an upper insulator layer 314, which may be comprised of the same or a different material than the thin insulator layer 310 or the lower insulator 312. Each of the insulator layers may be comprised of different or the same materials.

In another embodiment, at least some of the tunnel junction resistors may share a common conductive layer. This layer could be formed, masked, and then portions removed to form the individual metal pieces. Also, any other method of forming the metal pieces from a common conductive layer could be used. Alternatively, all of the upper metal pieces 306 may share a common conductive layer, while all of the lower metal pieces 302 may share a common conductive layer.

In a further embodiment, at least four tunnel junction resistors may be coupled in series. Alternatively, at least eight tunnel junction resistors may be coupled in series. In other applications, twenty or more tunnel junction resistors may be coupled in series. In addition, any number of tunnel junction resistors may be connected in series to achieve the desired resistance.

In one embodiment, the series of tunnel junction resistors are organized in a straight line. In another embodiment, the plurality of tunnel junction resistors that are coupled in series may be organized non-linearly. For instance, the tunnel junction resistors may be organized in a serpentine path, e.g., with one or more curves or bends. In other embodiments, the tunnel junction resistors may have an L-shape, a C-shape, a U-shape, etc. In further approaches, one or more of the tunnel junction resistors may be offset from a mean centerline.

In a further embodiment, the tunnel junction resistor system further comprises a magnetorestrictive sensor that may be coupled in parallel to the plurality of tunnel junction resistors that are coupled in series. The tunnel junction resistor system's overall resistance may be set according to the desired resistance based on the magnetorestrictive sensor employed in parallel.

Figure 8B:
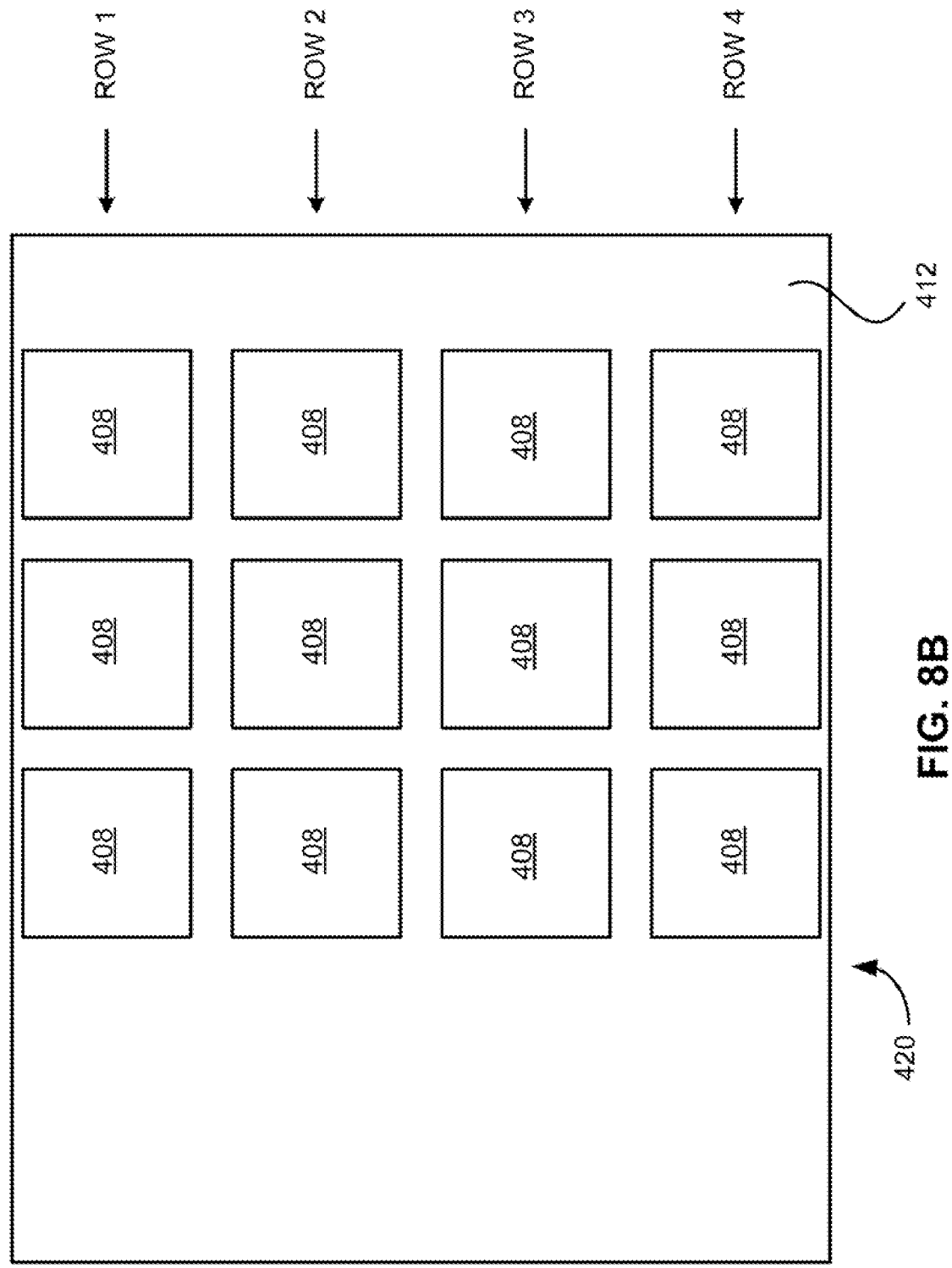
FIG. 8B is a simplified schematic of an upper portion of a tunnel junction resistor system according to one embodiment.

FIG. 8A shows a simplified schematic of a lower portion 400 of a tunnel junction resistor system (440, FIG. 8C) according to one embodiment. In this figure, a substrate 406 forms a support for the placement of the lower metal pieces 402, 404, 408, 410. In this embodiment, there are three kinds of metal pieces, a first lead 402, a second lead 404, small metal pieces 408, and large metal pieces 410. This arrangement is devised so that the electrical current can follow a path from the first lead 402 all the way through each metal piece and then exit through the second lead 404 once the lower portion is coupled with the upper portion shown in FIG. 8B.

FIG. 8B shows a simplified schematic of an upper portion 420 of a tunnel junction resistor system (440, FIG. 8C) according to one embodiment. In this figure, each metal piece 408 may be the same basic shape and size, and may be uniformly separated across another supporting structure, which is preferably a thin insulator layer 412. Alternatively, each metal piece may be of a different design so as to maximize the space of the tunnel junction resistor system (440, FIG. 8C). The metal pieces 408 are spaced according to the spacing of the metal pieces in the lower portion 400. This upper portion 420 will be placed above the lower portion 400 so that each metal piece in the upper portion 420 is aligned with two metal pieces in the lower portion 400.

Figure 8C:
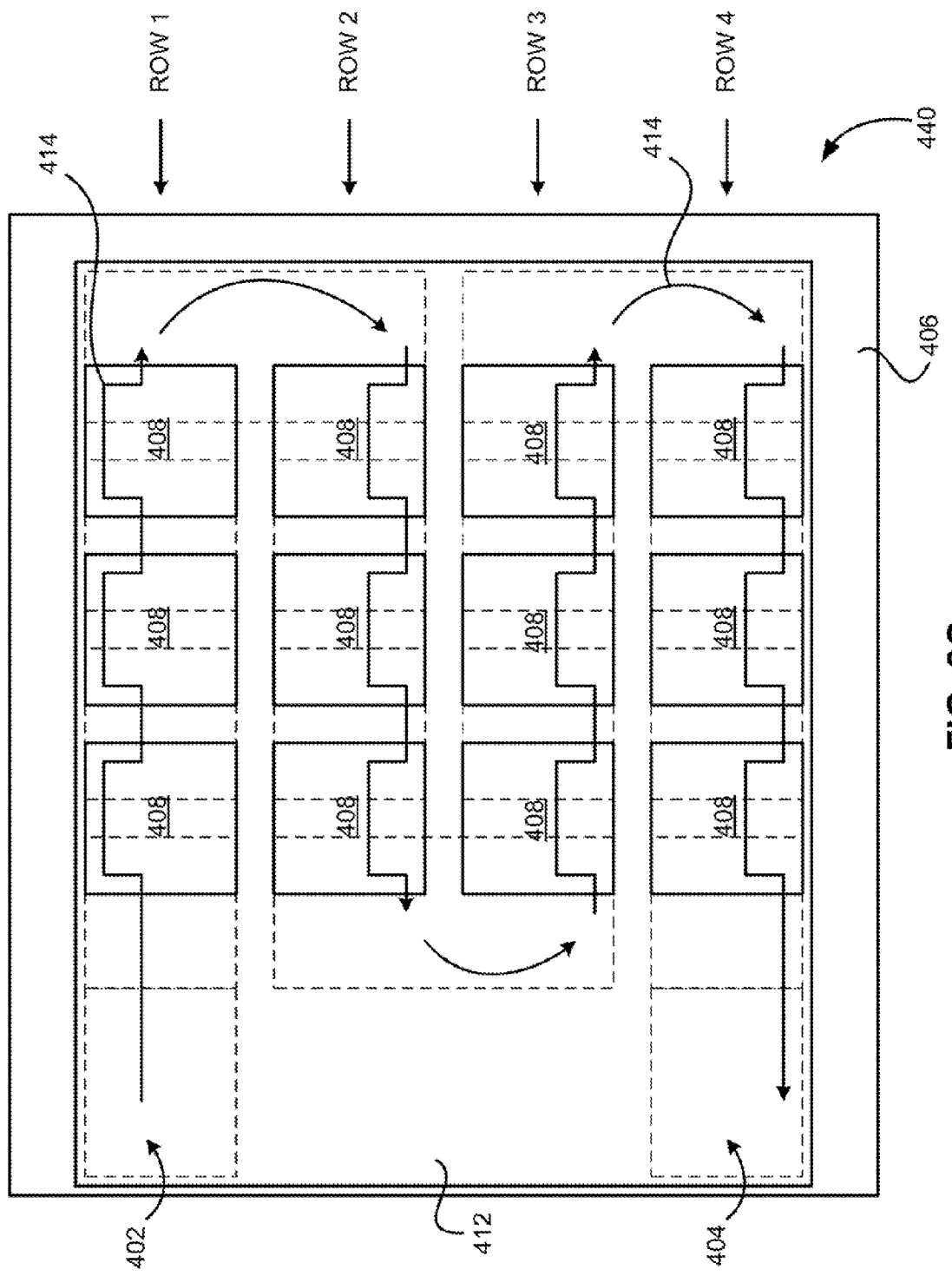
FIG. 8C is a simplified schematic of a tunnel junction resistor system according to one embodiment.

FIG. 8C shows a simplified schematic of the upper 420 and lower portions 400 of a tunnel junction resistor system 440 fully assembled according to one embodiment. The lower portion 400 is shown in dashed lines because it is underneath the upper portion 420. Each row is designated by number, and several arrows 414 show a flow path as an electrical current could pass through the tunnel junction resistor system 440. A current could enter the first lead 402, pass into the first metal piece in the lower portion 400, and then tunnel through the thin insulator layer 412 up to the first metal piece in the upper portion. This is indicated by the arrow 414 moving in an upward direction. Then, the current could pass through the first metal piece in the upper portion before tunneling back through the thin insulator layer 412 and back into a metal piece in the lower portion. This is indicated by the arrow 414 moving in a downward direction. This process is repeated until the current could pass through the second lead 404 and exit the tunnel junction resistor 440.

This tunnel junction resistor system 440 is just one example of how a plurality of tunnel junction resistors may be arranged, and in no way limits the arrangement of the tunnel junction resistors in series. Other examples include an L-shape, a C-shape, a U-shape, etc. Each arrangement may be chosen as is needed for each individual application taking into account overall resistance and design space constraints.

Figure 8D:
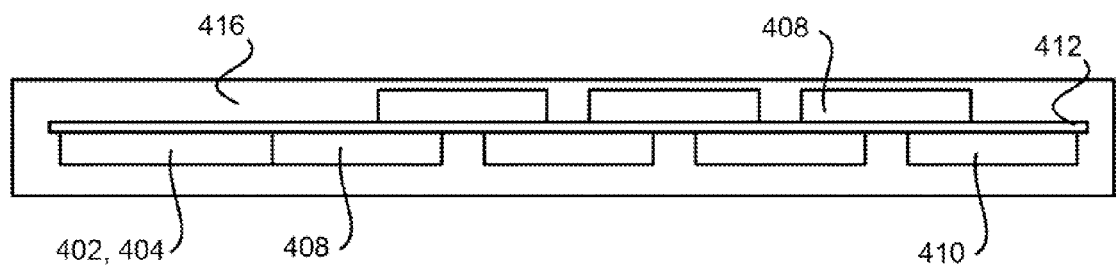
FIG. 8D is a side view of Rows 1 and 4 of a tunnel junction resistor system according to one embodiment.

FIG. 8D shows a side view consistent with Rows 1 and 4 of a tunnel junction resistor system 440 according to one embodiment. Row 1 will have first lead 402 on the left end, while Row 4 will have second lead 404 on the left end. The material surrounding the upper and lower portions 420, 400 is an insulator 416, and may be the same or different for the upper and lower portion 420, 400.

Figure 8E:
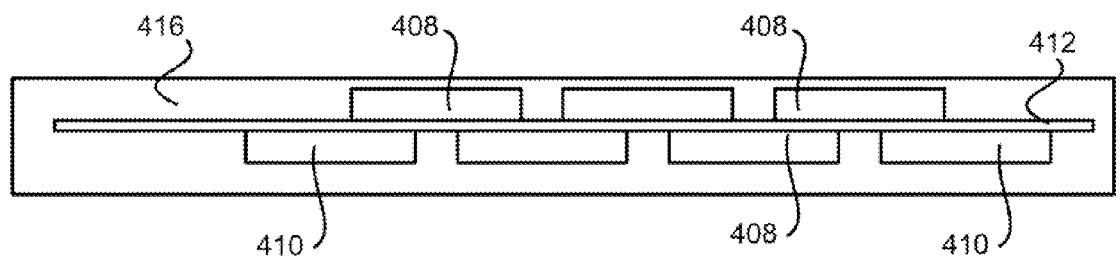
FIG. 8E is a side view of Rows 2 and 3 of a tunnel junction resistor system according to one embodiment.

FIG. 8E shows a side view consistent with Rows 2 and 3 of a tunnel junction resistor system 440 according to one embodiment. Rows 2 and 3 each have small metal pieces 408 in the upper portion 420, with two large metal pieces 410 on either side of two small metal pieces 408 in the lower portion 400. The material surrounding the upper and lower portions 420, 400 is an insulator 416, and may be the same or different for the upper and lower portion 420, 400.

In one particularly preferred embodiment of a system implementing tunnel junction resistors, a magnetic head comprises a magnetoresistive sensor; a plurality of tunnel junction resistors coupled in series; and a first lead coupling one end of the magnetoresistive sensor to one end of the plurality of tunnel junction resistors coupled in series; and a second lead coupling another end of the magnetoresistive sensor to another end of the plurality of tunnel junction resistors coupled in series. As an example, the magnetic head in FIG. 1 could be comprised of a magnetoresistive sensor that is coupled to the tunnel junction resistor system shown in FIG. 8C through the first and second leads. In this embodiment as shown in FIG. 8C, at least some of the tunnel junction resistors may share a common tunnel barrier layer. However, in another approach, all or none of the tunnel junction resistors may share a common tunnel barrier layer.

In another approach, where at least some of the tunnel junction resistors share a common tunnel barrier layer, at least some of the tunnel junction resistors also share a common conductive layer.

In yet another approach, where all of the tunnel junction resistors share a common tunnel barrier layer, at least some of the tunnel junction resistors share a common conductive layer.

In a further approach, at least four tunnel junction resistors may be coupled in series. Alternatively, at least eight tunnel junction resistors may be coupled in series. In other applications, twenty or more tunnel junction resistors may be coupled in series. In addition, any number of tunnel junction resistors may be connected in series to achieve the desired resistance.

In yet another approach, the plurality of tunnel junction resistors coupled in series may be organized in a straight line.

Figure 9A:
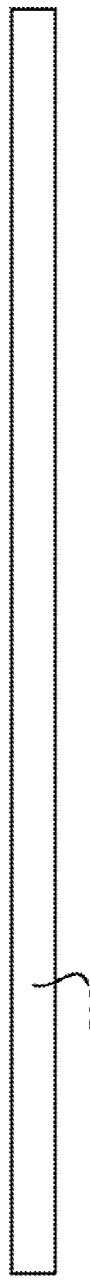

FIGS. 9A-9H show steps in an exemplary manufacturing process for creating a tunnel junction resistor system (500, FIG. 9H) according to one embodiment. In FIG. 9A, a substrate 502 is formed and planarized. This substrate 502 may be of any kind commonly used in semiconductor and magnetoresistive device construction.

Figure 9B:
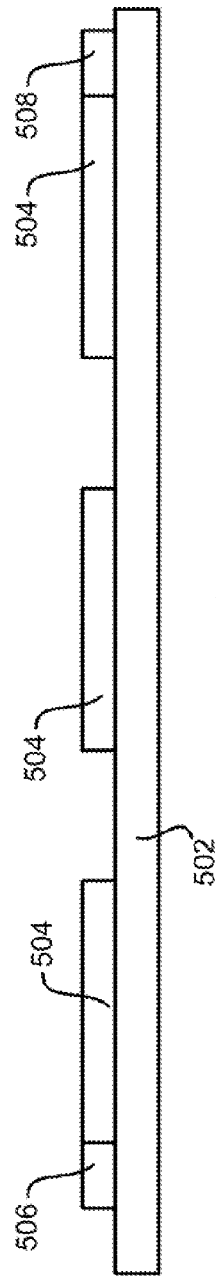

In FIG. 9B, a plurality of lower metal pieces 504 are formed above the substrate 502, along with a first lead 506 and a second lead 508. The leads 506, 508 may be of the same or a different conductive material than the lower metal pieces 504. Also, each metal piece may be of the same or a different conductive material.

Figure 9C:
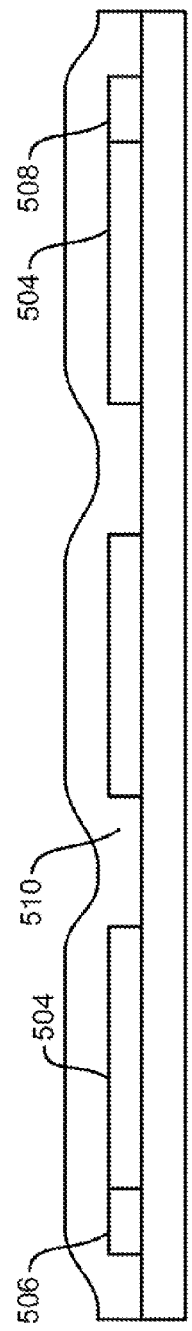

In FIG. 9C, an insulator layer 510 is formed over the lower metal pieces 504, the leads 506, 508, and the exposed substrate 502.

Figure 9D:
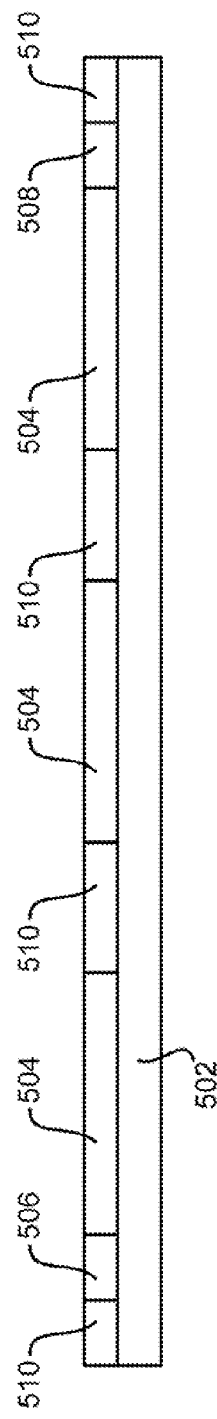

In FIG. 9D, the insulator layer 510 is planarized with the metal pieces and leads to be an even surface. This results in each metal piece being insulated from each other by an insulator layer 510.

In FIG. 9E, a thin insulator layer 514 may be formed over the planarized surface. This insulator layer will act as the tunnel barrier layer once the upper portion is formed. It may be of the same or a different insulative material than that of the insulator layer 510.

In FIG. 9F, upper metal pieces 512 are formed above the upper surface of the thin insulator layer 514. The upper metal pieces 512 may be of the same or a different conductive material than that of the lower metal pieces 504. The upper metal pieces 512 may also be of the same size and shape as one another, or may be of a different size and shape depending on the desired resistive effect of the tunnel junction resistor system (FIG. 9H, 500). The upper metal pieces 512 may also be of the same size and shape as the lower metal pieces 504, or may be of a different size and shape. The upper metal pieces 512 are formed so that each is above two of the lower metal pieces 504. Tunnel junctions can then be formed between the vertical overlaps of the upper and lower metal pieces 512, 504.

In FIG. 9G, an upper insulator layer 516 is formed above the upper metal pieces 512 and the exposed thin insulator material 514. It may be of the same or a different insulative material than that of the insulator layer 510 or that of the thin insulator material 514.

In FIG. 9H, a tunnel junction resistor system 500 is shown according to one embodiment. The upper insulator layer 516 may be planarized so that it is flat, and still covers the surface of the upper metal pieces 512.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A device, comprising:
   a plurality of tunnel junction resistors coupled in series;
   a first lead coupled to one end of the plurality of tunnel junction resistors coupled in series; and
   a second lead coupled to another end of the plurality of tunnel junction resistors coupled in series,
   wherein at least some of the tunnel junction resistors share a common tunnel barrier layer extending as a continuous layer between the tunnel junction resistors that share the common tunnel barrier layer,
   wherein at least four tunnel junction resistors are coupled in series.

2. A device comprising:
   a plurality of tunnel junction resistors coupled in series;
   a first lead coupled to one end of the plurality of tunnel junction resistors coupled in series; and
   a second lead coupled to another end of the plurality of tunnel junction resistors coupled in series,
   wherein at least some of the tunnel junction resistors share a common tunnel barrier layer extending as a continuous layer between the tunnel junction resistors that share the common tunnel harder layer, and
   wherein a breakdown voltage of the plurality of tunnel junction resistors coupled in series is at least 4 volts.

3. A device, comprising:
   magnetoresistive sensor;
   a plurality of tunnel junction resistors coupled in series;
   a first lead coupling one end of the magnetoresistive sensor to one end of the plurality of tunnel junction resistors coupled in series; and
   a second lead coupling another end of the magnetoresistive sensor to another end of the plurality of tunnel junction resistors coupled in series, wherein at least some of the tunnel junction resistors share a common tunnel barrier layer extending as a continuous layer between the tunnel junction resistors that share the common tunnel barrier layer.

4. A device as recited in claim 3, wherein at least some of the tunnel junction resistors share a common conductive layer.

5. A device as recited in claim 3, wherein all of the tunnel junction resistors share a common tunnel barrier layer.

6. A device as recited in claim 3, wherein the magnetoresistive sensor is coupled in parallel to the plurality of tunnel junction resistors coupled in series.

7. A device as recited in claim 3, wherein none of the tunnel junction resistors share a common tunnel barrier layer.

8. A device as recited in claim 3, wherein at least four tunnel junction resistors are coupled in series.

9. A device as recited in claim 3, wherein a breakdown voltage of the plurality of tunnel junction resistors coupled in series is at least 4 volts.

10. A device as recited in claim 3, wherein a series resistance of the plurality of tunnel junction resistors coupled in series is at least 10 kiloOhms.

11. A system, comprising:
a semiconductor device;
a plurality of tunnel junction resistors coupled in series;
a first lead coupling one end of the semiconductor device to one end of the plurality of tunnel junction resistors coupled in series; and
a second lead coupling another end of the semiconductor device to another end of the plurality of tunnel junction resistors coupled in series, wherein at least some of the tunnel junction resistors share a common tunnel barrier layer extending as a continuous layer between the tunnel junction resistors that share the common tunnel barrier layer.

12. A system as recited in claim 11, wherein a breakdown voltage of the plurality of tunnel junction resistors coupled in series is at least 4 volts.

13. A system as recited in claim 11, wherein a series resistance of the plurality of tunnel junction resistors coupled in series is at least 10 kiloOhms, wherein the semiconductor device is coupled in parallel to the plurality of tunnel junction resistors coupled in series.

* * * * *